United States Patent [19]
Klemptner et al.

[11] Patent Number: 5,055,436
[45] Date of Patent: Oct. 8, 1991

[54] METHOD FOR PREPARATION OF SUPERCONDUCTOR POWDERS

[75] Inventors: Lori J. Klemptner, Framingham; James D. Hodge, Medway; John W. Halloran, Hopkinton, all of Mass.

[73] Assignee: CPS Superconductor Corp., Milford, Mass.

[21] Appl. No.: 234,441

[22] Filed: Aug. 19, 1988

[51] Int. Cl.$^5$ ............ H01B 12/00; H01L 39/12; B05B 3/00; B29C 35/02
[52] U.S. Cl. .................... 501/152; 264/28; 505/1; 505/737; 505/739; 505/733
[58] Field of Search ............ 505/1, 742, 737, 738; 264/28

[56] References Cited

U.S. PATENT DOCUMENTS 2,893,102  7/1959  Maxwell et al. ............ 264/29
4,049,789  9/1977  Manabe et al. ............ 423/593

OTHER PUBLICATIONS

Beyers et al., "On the Relationship Between Processing, Structure, and Superconductivity in YDA$_2$Cu$_3$O$_{8-x}$", Extended Abstracts: High Temperature Superconductors, MRS Symposium (1987).
Uchida et al., "High Tc Superconductivity of LA--Br-Cu Oxides", (1986).
"Comparison of Carbonate Citrate and Oxalate Chemical Routes to the High-Tc Metal Oxide Superconductors LA$_{2-x}$Si$_x$CuO$_4$", Inorganic Chemistry, (1987).
Geballe et al., "Some Thoughts on High Tc Perovskite Superconductors", MRS Symposium (1987).
K. W. Lay, "Formation of Yttrium Barium Cuprate Powder at Low Temperatures," J. Am. Ceram. Soc., vol. 72, No. 4, 696-698 (1989); see also General Electric Co. Technical Information Series of Same Name, No. 88CRD144 (May 1988).
International Search Report for PCT/US89/03561.

Primary Examiner—William R. Dixon, Jr.
Assistant Examiner—Melissa Bonner

[57] ABSTRACT

An improved process for preparing superconducting ceramic powder includes calcining superconducting precursor compounds in an atmosphere having a controlled amount of oxygen, generally not more than that found in air, the remainder of the atmosphere composed of a gas or mixture of gases inert with respect to the ceramic. A preferred process includes forming the precursor compounds into a slurry, granulating the slurry, drying the granules (a binder can be added to the slurry to promote green strength), and calcining in the controlled atmosphere to provide the desired HTSC (high temperature superconductor) composition.

16 Claims, 6 Drawing Sheets

METHOD FOR PREPARATION OF SUPERCONDUCTOR POWDERS

This invention was made with Government support under Contract N00014-87-C-0789 awarded by the Department of the Navy. The government has certain rights in the invention.

BACKGROUND OF THE INVENTION

1. Field of the Invention

This invention relates to an improved method for the preparation of powders composed of high temperature superconducting ceramics, especially those composed of oxide ceramics.

2. The State of the Art

The recently discovered and investigated perovskite superconducting ceramics (e.g., $YBa_2Cu_3O_{7-x}$, also known as the "1-2-3" superconductor or "YBCO") are most amenable to processing into useful articles if first provided in the form of a phase-pure powder. Also, the preparation of high quality superconductor powders in large quantities via an economically viable process is a necessary requirement for the subsequent processing and commercial utilization of high temperature superconductors (HTSCs) in general.

To date, various production techniques have been investigated and reported in the literature. The most common method of preparing YBCO and similar HTSCs is by the solid state reaction of a physical mixture of the initial oxides: $CuO$, $Y_2O_3$, and $BaCO_3$. This technique involves calcining this physical mixture, grinding the calcination product, and repeating the calcination and grinding steps until a product of the desired phase purity is achieved. See, e.g., D.W. Johnson, et al., "Fabrication of Ceramic Articles from High Tc Superconducting Oxides," pub. in *Advanced Ceramic Materials*, Vol. 2, No. 3B, Special Issue entitled "Ceramic Superconductors," Amer. Cer. Soc. (1987). Such a process is time consuming as well as energy and labor intensive. Further, because an analysis or quality control step is needed to determine the results of each calcination, such a process is not readily scaled up to commercial production levels.

Another method of powder preparation is by the chemical precipitation of the appropriate salts from an aqueous solution; that is, the dissolution of the appropriate salts in water followed by the precipitation of the desired superconducting precursor. See, e.g., J.A. Voight, et al., "A Hydroxycarbonate Route to Superconductor Precursor Powders," *Mat. Res. Soc. Symp. Proc.*, Vol. 99 (Materials Research Society, Pittsburgh, PA: 1987). However, this type of method is not considered to be commercially feasible for a number of reasons: the salts required for these syntheses typically have a low solubility, thereby requiring large volumes of solution (and concomitantly large amounts of waste) to produce a relatively lesser amount of powder; the simultaneous precipitation of the desired reactants in the desired stoichiometric ratio is sensitive to numerous variables, such as pH, temperature, salt concentration, and so forth; and the precursor powder produced by these methods often has an extremely high surface area, thus resulting in problems with the subsequent processing of such powders. One method for recovering and subsequent processing of superconducting powders by this method is also discussed by S.M. Johnson et al., "Preparation of Superconducting Powders by Freeze-Drying," *Adv. Cer. Mat.* (Amer. Cer. Soc.), Vol. 2, No. 3B, Special Issue, 1987, pp. 337–342.

SUMMARY OF THE INVENTION

Accordingly, it would be beneficial to provide a method for the preparation of HTSC powders which overcomes the deficiencies of the foregoing processes.

Thus, the present invention provides a method for producing HTSC powders from inexpensive raw materials; a feature of the invention is that it is not composition specific, but instead is applicable to all HTSC ceramic powders/perovskite-based ceramics. This invention also provides a process that is readily amenable to scale-up to commercially desireable levels. The process is also very economical and commercially advantageous because it is a simple two-step process that results in a phase-pure superconductor composition.

In summary, the present invention includes a method comprising the steps of (a) providing a slurry composed of the superconducting precursors, a binder, a dispersant, and a solvent medium, (b) granulating the slurry, (c) drying the granules, and (d) calcining the granules in an inert atmosphere including an amount of oxygen substantially no greater than that found in air (i.e., about 20%).

In various preferred embodiments: the granulation is by freezing droplets of the slurry to form granules; the drying is by freeze drying (lyophilization); calcination is at a temperature of about $900°$ C.$\pm 50°$ C. (for YBCO); and the calcination atmosphere includes up to about 20% of oxygen, the remainder composed essentially of an inert gas such as nitrogen or argon.

DETAILED DESCRIPTION OF SPECIFIC EMBODIMENTS

Figure 1A:
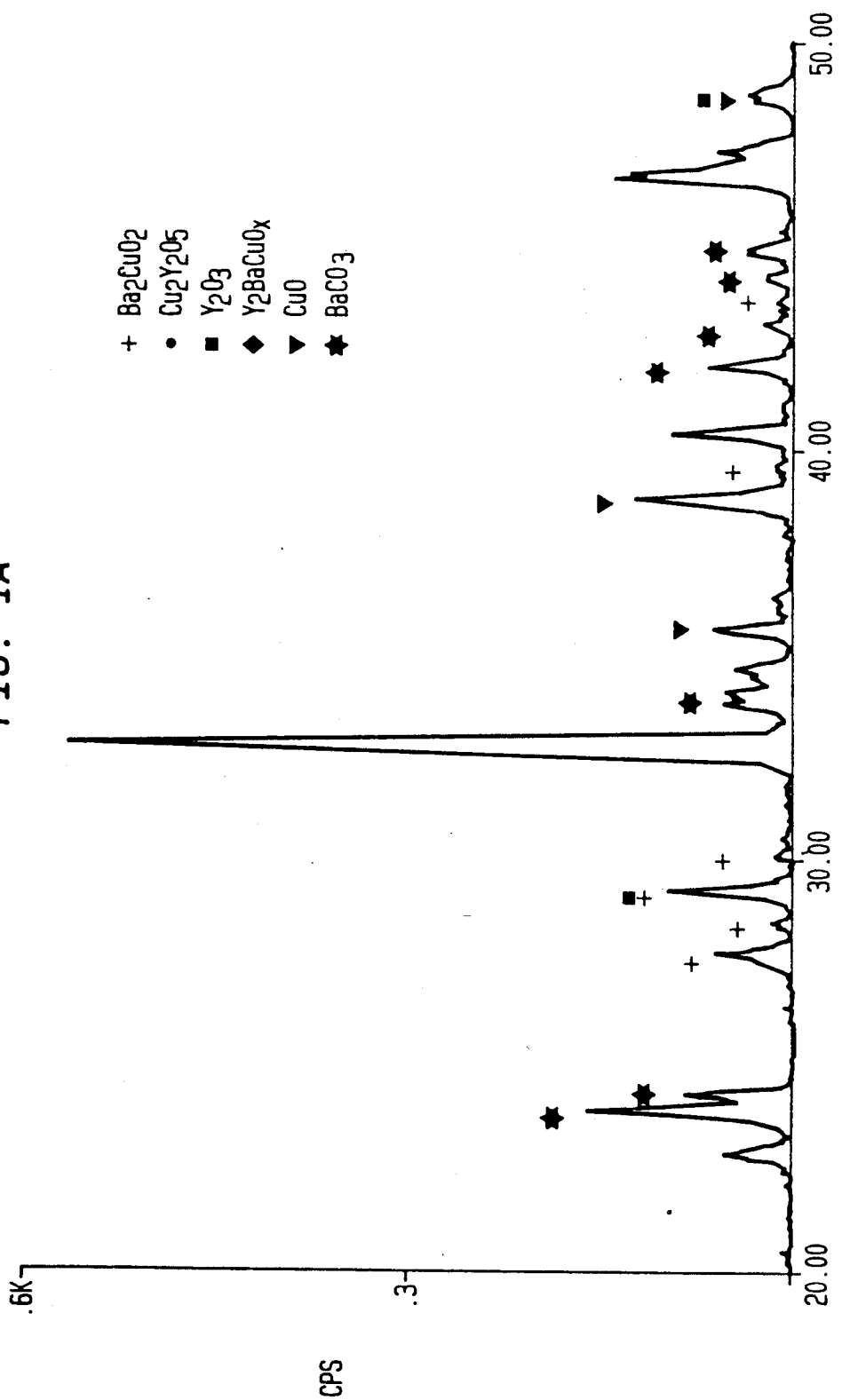
FIG. 1a and 1b depict XRDs (x-ray diffraction patterns) of two samples of YBCO powder made according to the invention, 1a for calcination in air and 1b for calcination in nitrogen.

This invention provides an improved method for the preparation of HTSC powders. Exemplary HTSC compositions include, but are not limited to, $LnBa_2Cu_3O_{7-x}$ (i.e., "YBCO"), $(Ln_{1-x}M_x)_2CuO_4$, $MPb_{1-x}Bi_xO_3$, $La_2CuO_4$, $Bi_2CaSr_2Cu_2O_8$, $M_2YCu_3O_7$, $Tl_2Ba_2Ca_2Cu_3O_x$, $Tl_2Ba_2Ca_1Cu_2O_x$, $Tl_2Ba_2CuO_x$, and mixtures thereof, wherein $0 < x \leq 0.15$ (preferably $0 < x \leq 0.10$), Ln represents an element having an atomic number of 57 to 71 (i.e., lanthanum or an element of the lanthanide series) or mixtures thereof, and M is Ba, Sr, Ca, or mixtures thereof.

These HTSC perovskites are superconducting when the stoichiometry evidences hyperoxygenation, as shown by the above formulae. In general, the non-superconducting perovskite is prepared and is subsequently annealed in an oxygen-containing atmosphere to provide the desired stoichiometry. The HTSCs can be prepared by calcining a number of different precursor compounds, such as oxides, carbonates, hydroxides, hydrides, nitrates, acetates, citrates, peroxides, and similar precursor compounds. As used herein, the term 'superconductor precursor' or 'precursor' is intended to include all such precursors, and mixtures thereof, which, when calcined, provide the desired perovskite suitable for high temperature superconducting applications. For example, a precursor can be a powder mixture of the necessary oxide precursors or it can be a sol-gel product of the proper composition.

As typical in calcining processes for providing ceramic compositions by solid state reaction, the superconductor precursors are prepared for calcining by grinding to the desired particle size; preferably this is an average particle size of about 2 microns. For example, for the preparation of YBCO from barium carbonate, copper (II) oxide, and yttrium oxide, the respective preferred particle sizes are not greater than about one micron for the first two components and not greater than about five microns for the last component. In accordance with preferred aspects of the invention discussed below, the superconductor precursors are prepared first in the form of a pourable slurry (i.e., a viscosity of less than about 1000 cPs at 100 s$^{-1}$) having a solids loading of 15 vol.% to 50 vol.% precursor solids.

To facilitate achieving a homogenous, pourable slurry, a dispersant is added, which may be present in amounts of from about 0.1 wt.% to about 10 wt.% based on the precursor solids, more preferably from about 1.0 wt.% to about 5.0 wt.%. For aqueous-based slurries, exemplary dispersants include, but are not limited to polyelectrolytic polyacrylates (e.g., those available under the designation NARLEX LD-45 and NARLEX LD-42, acrylate copolymers including, respectively, ammonium and sodium salts, from National Starch and Chemical Corp., Bridgewater, NJ; ammonium salts of carboxylated polyelectrolytes such as TAMOL SG-1 and TAMOL 901, available from Rohm & Haas Co., Philadelphia, PA; DARVAN 821A, a polyelectrolyte of an ammonium salt, available from R.T. Vanderbilt Co., Norwalk, CT), and modified alkanolamides (e.g., cocamide DEA (diethanolamide), available under the designations WITCAMIDE 272 and WITCAMIDE 511 from Witco Chem. Co., Org. Chem. Div., Perth Amboy, NJ, and under the designation CLINDROL 101CG, available from Clintwood Chem. Co., Chicago, IL); other dispersants are determinable by one of ordinary skill in the art, as such is typically done by empirical methods.

The aqueous vehicle, the dispersant, and the precursors are mixed using a high energy mixer, such as in a vibratory mill, which is an energy intensive device. In this preferred embodiment, homogenizing and grinding are performed simultaneously on the precursors, so milling media are also present. Any conventional media can be used, such as those composed of alumina or silica. However, zirconia is a preferred milling medium because it provides certain benefits. First, the high density of zirconia promotes more efficient milling. Second, it has been reported that zirconia contaminants in the superconductor powder are less detrimental than contaminants from alumina and silica. The slurry is milled for 18 to 36 hours, preferably for about 20-24 hours.

After milling to provide a well-mixed, homogeneous, pourable slurry with an appropriate average particle size and distribution, the slurry is granulated. This process step can be accomplished in various manners, such as spray-drying, dry granulation, and similar well known methods. It is preferred to granulate by freezing, such as by injecting the slurry by drops into liquid nitrogen to provide individual frozen granules.

The granules are subsequently dried, such as by evaporation at ambient conditions, by heating, and most preferably in the case of frozen granules, by sublimative drying (e.g., freeze drying).

In order to provide green strength to the dried granules, the slurry preferably further includes a binder in an amount of about 0.25 wt.% to about 10 wt.%, also based on the precursor solids. Preferred binders include polyethylene glycol (e.g., PEG 600, a polyethylene glycol having a molecular weight of about 600, available from Union Carbide Corp., Danbury, CT), as well as other polyethylene glycols with molecular weights between about 200 and 4600.

There are a number of advantages to the preferred process as described thus far. Granulation by freezing the slurry preserves the homogeneity of the slurry for subsequent processing steps. Also, freeze drying allows for the use of precursor compounds which may be somewhat water soluble (e.g., CuO and BaCO$_3$ have a low, but finite, solubility in aqueous systems) without the loss of those components (i.e., the desired stoichiometry is maintained); granulation facilitates the subsequent calcination (as described in more detail later); and the presence of the binder achieves sufficient green strength for further processing.

The green granules are then calcined. We have discovered that regulation of the calcination atmosphere is an important aspect for achieving the desired HTSC, regardless of how the green ceramic is prepared. We have also found unexpectedly that the duration of calcination required for conversion of the precursor components to a phase pure product is very dependent upon the calcination atmosphere.

Contrary to current popular beliefs, we have found unexpectedly that essentially pure oxygen is a poor calcining atmosphere. Rather, it is preferred to limit the oxygen content of the atmosphere to about less than about 10%, with the maximum desireable being about 20% (the amount found in air), and with a minimum oxygen content of down to less than 1%. Our studies indicate that oxygen suppresses the reaction necessary to form the superconductor compound, and thus its presence should be minimized, although it need not be entirely eliminated. In fact, even the amount of oxygen present in air exceeds the most desireable levels. For example, under identical conditions, calcination in air requires 15 hours to reach completion, while reaction in essentially pure nitrogen is substantially complete in only about ½ hour. It is preferred to perform calcination in a nitrogen rich atmosphere, which greatly accelerates the reaction necessary to form the superconducting phase. It is most preferred to provide a nitrogen-rich atmosphere composed of a mixture of nitrogen and air. A preferred calcination atmosphere includes a ratio of air to nitrogen in the range of 1:10 to 1:3. In various other embodiments, nitrogen can be replaced, in whole or in part, with other inert gases, such as argon, helium, and the like. In general, this invention is applicable to any superconducting precursor where oxygen in the calcination atmosphere would be detrimental (e.g., where organics might be evolved).

The calcination temperature is readily determinable by one of ordinary skill in the art depending on the specific composition, and is generally between 800° C.

and 950° C. for YBCO. For the present invention, calcination is preferably accomplished at about 900° C. to 925° C. In general, temperatures greater than those preferred tend to increase the decomposition of the desired HTSC phase, and temperatures less than those preferred tend to increase the calcination period required (due to reduced kinetics).

Accordingly, it is also important that the green ceramic be well-infused with the calcination atmosphere to promote the desired reaction kinetics. In this aspect, granulation is advantageous by allowing rapid and continuous percolation of the atmosphere among the green ceramic granules. It may be within the ability of the skilled artisan to calcine a block of green ceramic, separate the desired calcination reaction phase at the surface, and continue the calcination; or perhaps to calcine an article in the geometry of a sheet. Nevertheless, from a production and scale-up view, granulation and percolation are thus more preferable. Various other modifications can be developed, such as a fluidized or circulating bed reactor for calcining, or involving the use of a rotary calcining furnace.

The nitrogen-rich calcination atmosphere accelerates the calcination reaction, and also accelerates the densification reaction of the individual granules. Consequently, nitrogen-calcined material consists of very hard agglomerates, which must be vigorously milled to produce a useful powder. Thus, calcination atmosphere (and, consequently, calcination time) must be balanced against milling time (for the calcined product). Of course, the use of smaller granules may reduce the time and/or energy for both of these costs, but smaller granules may be more difficult to produce. On the other hand, depending on the calcination apparatus, smaller granules may pack together within the calcining "bed" such that "percolation" is prevented or such that channels develop. The preferred granule size is from about ½ mm to about 5 mm.

The following is an example of a preferred method for carrying out our invention:

The following components (in approximate amounts) were mixed in a one-liter milling bottle:

| | | |
|---|---|---|
| 200.0 g. deionized water | | |
| 11.5 g. NARLEX LD-45 (dispersant) | (1.0 wt. %) | |
| 15.2 g. PEG 600 (binder) | (1.4 wt. %) | |
| 585.8 g. $BaCO_3$ | (53 wt. %) | |
| 165.0 g. $Y_2O_3$ | (15 wt. %) | |
| 352.3 g. CuO | (32 wt. %) | |

(As noted above, the binder and dispersant weight fractions are based on the precursor solids present.) This mixture therefore included 50 vol.% of precursor solids.

1300 g. of ⅜" zirconia cylindrical milling media were added, and the slurry was milled for 22-23 hours on a Sweco vibratory mill (available from Sweco Co., Florence, KY).

After milling, the homogeneous slurry was poured out of the milling jar into an agitated holding tank, from where it was pumped through 16-gauge hypodermic needles into a Dewar flask of liquid nitrogen at a rate of approximately 13 ml/min/needle. This resulted in essentially spherical, frozen granules, having diameters of from about 2 mm to about 5 mm. The frozen granules were then dried in a commercial freeze drier to remove the frozen process water.

A calcining apparatus was provided as follows: a grate pattern was cut into the bottom of a standard cylindrical aluminum crucible. An alumina ring was fitted radially with a stainless steel gas inlet tube, and one circumference of the ring was cemented onto an alumina cover plate, thereby providing a device for directing gas flow upwards within the ring circumference. The alumina ring assembly was placed inside a box furnace, the granules were placed into the crucible, and the crucible was placed on top of the ring apparatus.

Various flows of 80-99+% nitrogen and <1-20% oxygen were infused through the ring and upwards through the filled crucible and the furnace was heated to 900° C. We have found that the densification reaction causes shrinkage of the granules and a congregation of the granules in the center of the crucible, thereby creating a gap between the crucible wall and the shrunken granule mass through which the process gas can easily bypass. Accordingly, calcining was accomplished in two stages: during the first stage there was a short hold at the calcining temperature to allow the granules to undergo most of their shrinkage; thereafter, the consolidated granule mass was broken up into discrete granules, which were poured back into the crucible, and calcining was continued for a time period dependent upon the specific atmosphere composition and the solids loading of the granules. The calcined mass was then ground by conventional techniques to provide YBCO powder suitable for commercial use. A desireable modification is the use of a rotary calciner to obviate the need for the two-stage calcining in the lab-scale apparatus; a single stage calcining would be possible because of the constant agitation of and the gas flow around the granules.

It should be noted that as part of the calcination step it is possible to facilitate the formation a desired phase. In particular, for YBCO the calcined granules can be cooled slowly in air, whereupon the proper superconducting orthorhombic phase is generated. We have found that, with respect to the YBCO superconducting materials, it is not necessary to anneal in oxygen to achieve the orthorhombic phase.

Figure 1B:
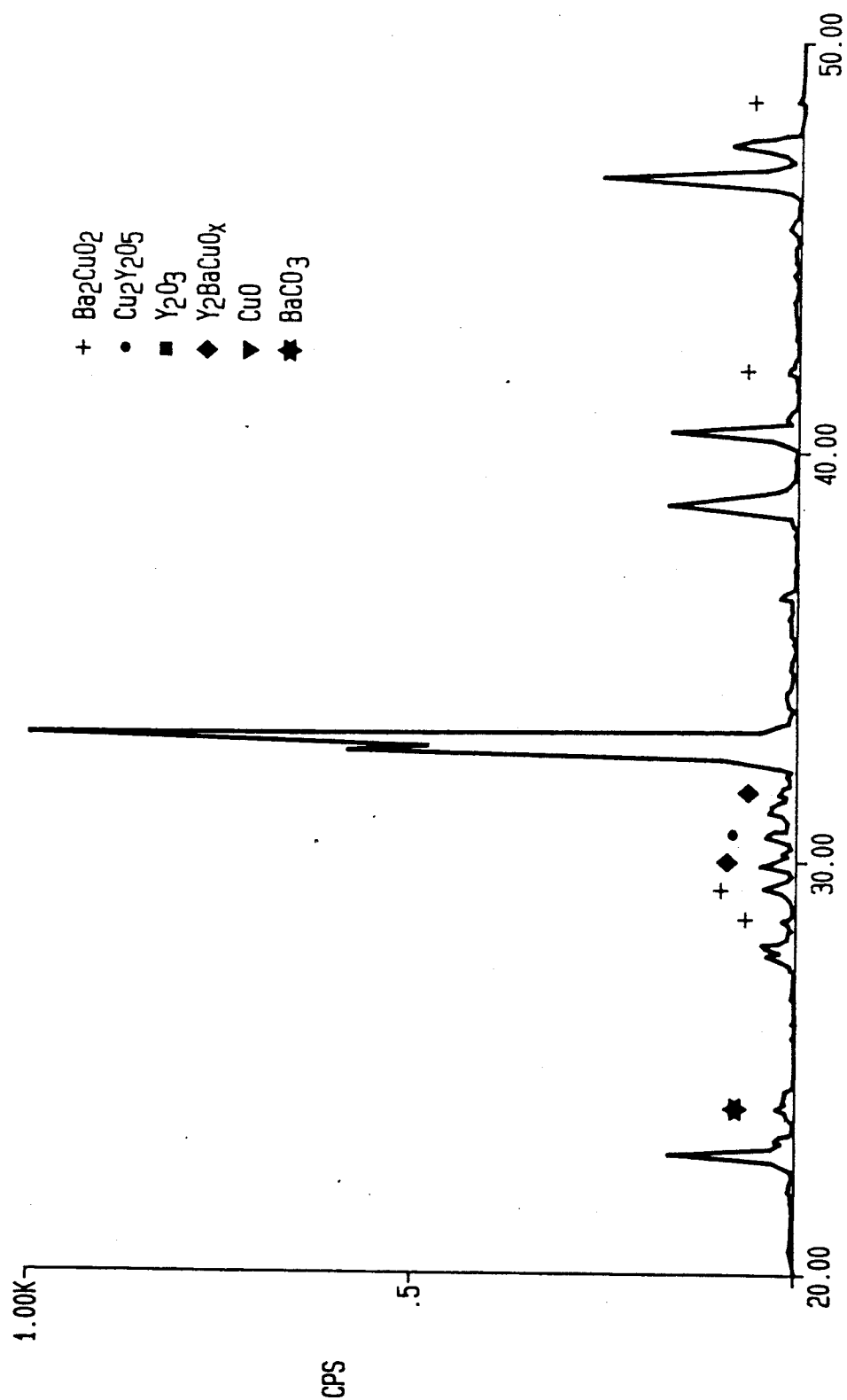
Figure 2A:
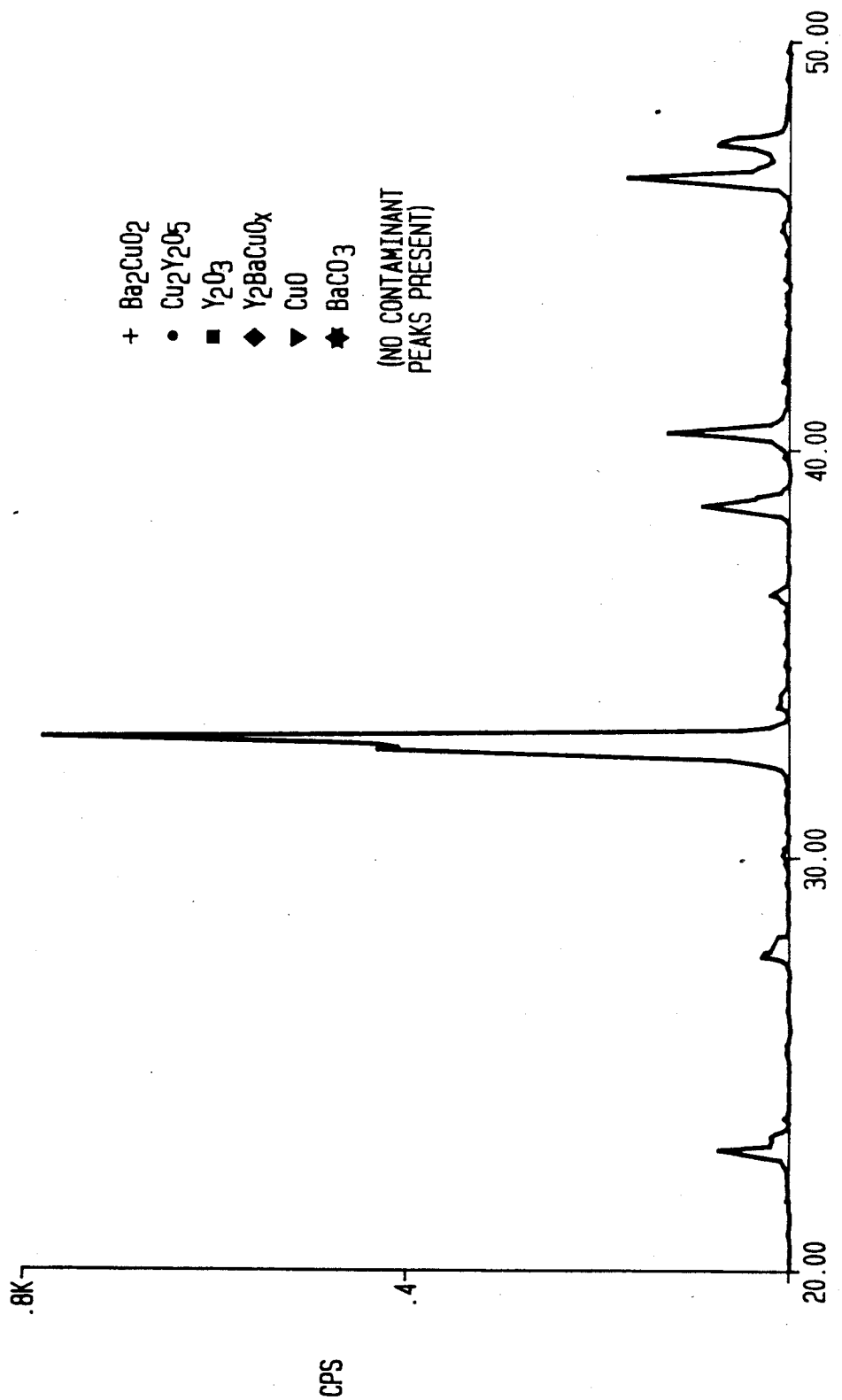
FIGS. 2a, 2b, and 2c all depict XRDs of YBCO powder made (a) according to the invention compared with two commercially available powders (b) and (c).
Figure 2B:
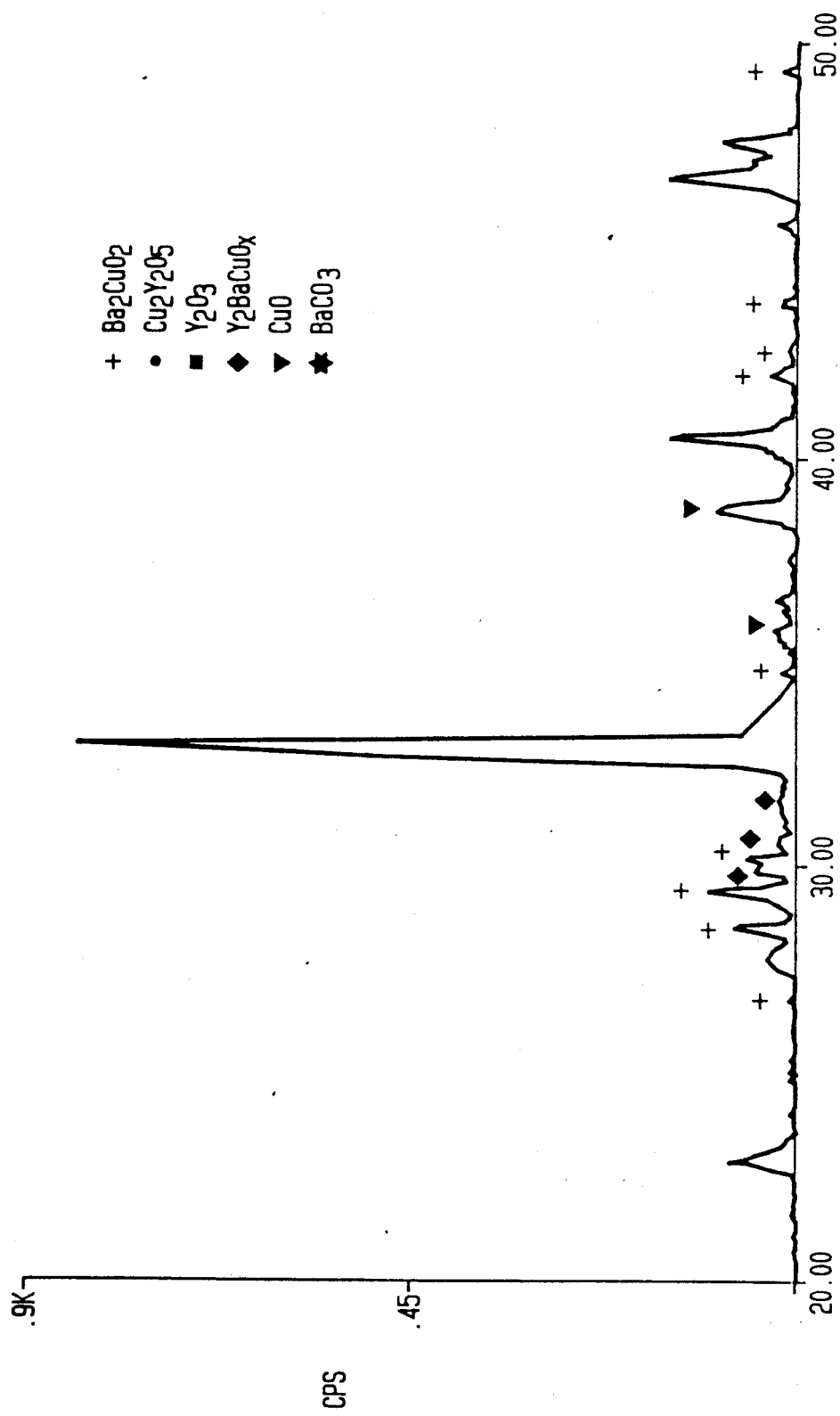
Figure 2C:
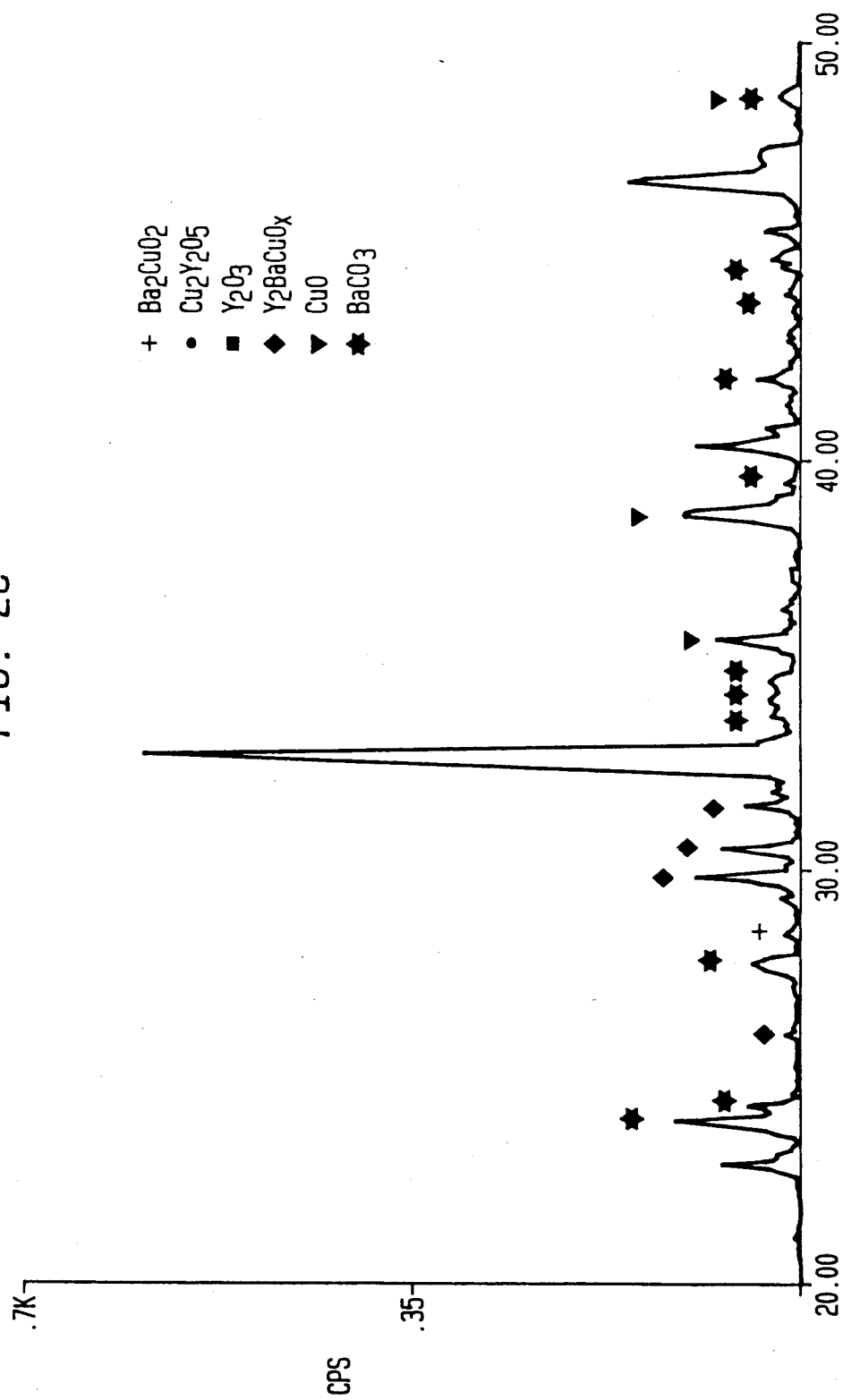

The calcined and commercially useful product can be characterized in a number of ways. For example, FIG. 1a depicts an XRD of YBCO powder calcined in air for 30 minutes, and FIG. 1b depicts an XRD of YBCO powder calcined in nitrogen for the same period of time. A comparison of the two clearly shows that calcination with less oxygen present leads to a more complete calcination reaction and a product with fewer impurities and unreacted components. FIG. 2a shows an XRD of YBCO powder made according to the invention and calcined in an atmosphere having an $N_2:O_2$ ratio of 6.8:0.2, FIG. 2b shows an XRD of an as-calcined YBCO powder commercially available from Rhine-Poulenc, Monmouth, NJ, and FIG. 2c shows an XRD of YBCO powder commercially available from SuperConductive Components, Inc., Columbus, OH. FIG. 2 clearly shows that the present process provides phase pure, high purity superconducting powders as-calcined, a substantial improvement over the current state of the art.

Certain beneficial modifications can be made or added to the process. For example, the use of a CuO-rich composition would allow for the formation of stable liquid phases. This could be used to control the morphology of the resulting material, e.g., exhibiting more of a platey habit. Liquid phase sintering can be achieved by admixing copper oxide powder with the ground, calcined powder; for copper oxide, the amount is preferably 1-10 wt.%.

Figure 3A:
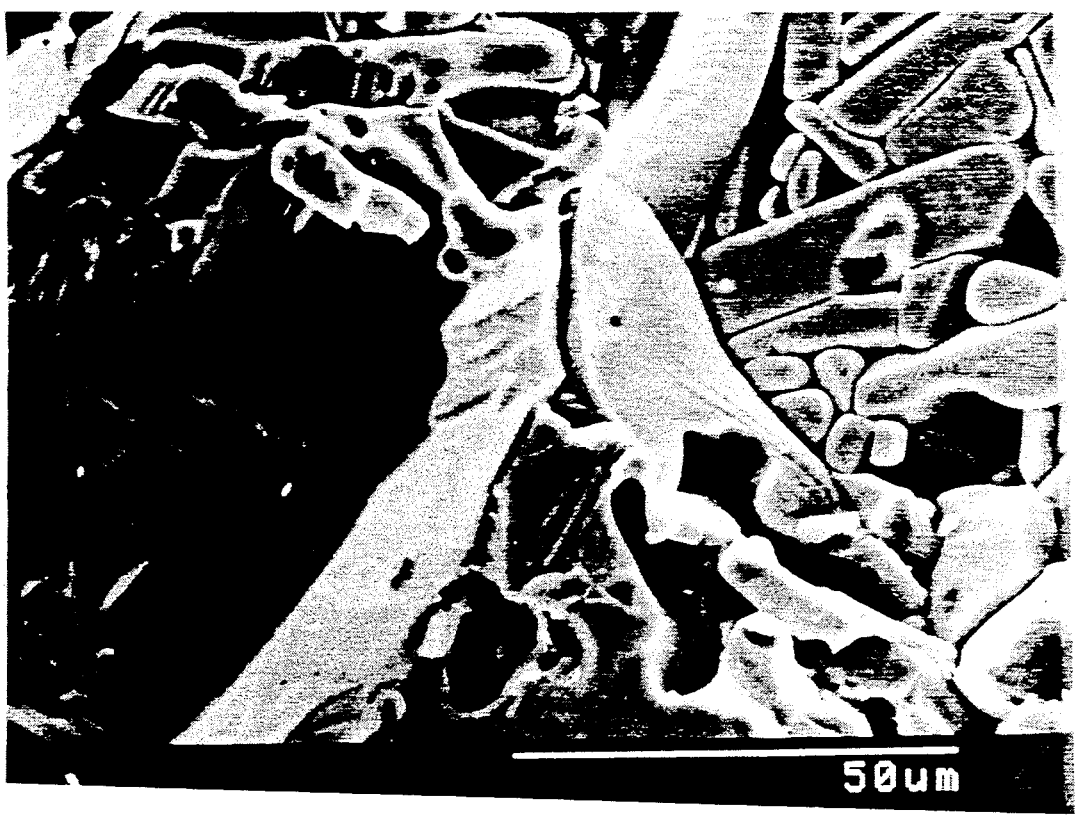
FIG. 3a depicts an SEM (scanning electron micrograph) of the fracture surface of a sintered pellet made from powder prepared in accordance with the invention and where the composition includes a 5 wt.% CuO dopant.
Figure 3B:
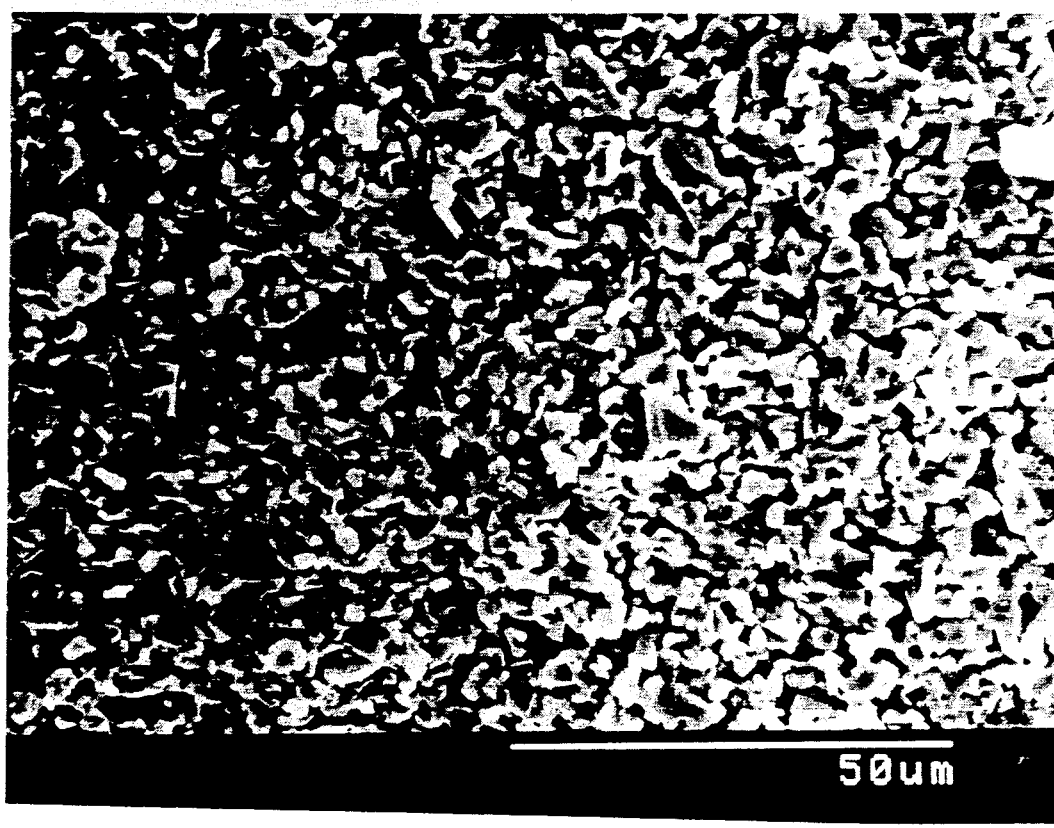
FIG. 3b depicts an SEM of the fracture surface of a sintered pellet without the 5 wt.% CuO dopant.

FIG. 3a is an SEM of a fracture surface of a pellet, pressed from powder made according to our invention, sintered for 15 hours at 975° C. and having a composition of YBCO with an addition of 5 wt.% copper oxide; FIG. 3b is an SEM of a fracture surface of a pellet without the copper oxide dopant and sintered under identical conditions. These SEM micrographs clearly show that the morphology of the resulting material is greatly altered by the presence of a liquid phase during sintering.

As noted above, the present invention is not material specific; the production of other HTSC materials is within the broad and preferred subprocesses described herein, including such subprocesses as milling to insure the homogeneity of components, rapid granulating/drying (e.g., freezing/freeze drying) to preserve this homogeneity, and atmosphere control during calcination to facilitate the solid state reaction. Of course, specific HTSC compositions may require some adjustment to the foregoing description. However, the present process has been demonstrated for the above YBCO compositions, for bismuth based superconductors (where the only necessary change was using a calcination temperature of 800°-825° C.), and is readily adaptable to other HTSC compositions (such as those based on thallium, for which calcination and other conditions were given, for example, by Z.Z. Sheng and A.M. Hermann (Univ. of Arkansas, Dept. of Phys.) at the World Congress on Superconductivity, Houston, TX, 1988).

The foregoing description is meant to illustrate various embodiments of the invention and is not meant to be limiting. Upon reviewing the present specification, various modifications to the invention may become apparent to the skilled artisan, which changes are intended to be within the scope and spirit of the present invention as defined by the claims.

What is claimed is:

1. A method for preparing ceramic superconducting powder, comprising the steps of:
   (a) providing a pourable slurry having 15% to 50% by volume of solids and composed of
      (i) superconducting precursors,
      (ii) a binder,
      (iii) a dispersant, and
      (iv) a solvent;
   (b) granulating the slurry by freezing;
   (c) drying the granules;
   (d) providing a bed of the granules;
   (e) calcining the granules while percolating through the bed an atmosphere composed of not more than 20% oxygen and the remainder being an inert gas; and
   (f) grinding the calcined granules into a powder.

2. The method as defined by claim 1, wherein the superconducting powder is a composition selected from the group consisting of $LnM_2Cu_3O_7$, $(Ln_{1-x}M_x)_2CuO_4$, $MPb_{1-x}Bi_xO_3$, $La_2CuO_4$, $Bi_2CaSr_2Cu_2O_8$, $Tl_2Ba_2Ca_2Cu_3O_x$, $Tl_2Ba_2Ca_1Cu_2O_x$, $Tl_2Ba_2CuO_x$, and mixtures thereof, wherein $0 < x \leq 0.1$, Ln is Y or an element having an atomic number of 57 to 71 or mixtures thereof, and M is Ba, Sr, Ca, or mixtures thereof.

3. The method as defined by claim 1, wherein the precursor is an oxide, carbide, carbonate, hydroxide, hydride, nitrate, acetate, citrate, peroxide, or mixture thereof, of an element in the superconducting powder.

4. The method as defined by claim 1, wherein the binder is a polyethylene glycol having a molecular weight within the range of about 200 to about 4600.

5. The method as defined by claim 1, wherein the dispersant is a polyelectrolytic polyacrylate or a modified alkanolamine.

6. The method as defined by claim 1, wherein the atmosphere is composed of at least 80% nitrogen.

7. The method as defined by claim 1, wherein the atmosphere is composed of 1% to 20% oxygen.

8. The method as defined by claim 1, wherein the calcination temperature is 900° C.±50° C.

9. The method as defined by claim 8, wherein the calcination temperature is 900° C.±5° C.

10. The method as defined by claim 8, wherein the ceramic superconducting powder is $LnBa_2Cu_3O_{7-x}$, wherein $0 < x < 0.15$, and Ln represents an element having an atomic number of 57 to 71 or mixtures thereof.

11. The method as defined by claim 1, wherein drying is essentially by sublimation.

12. The method as defined by claim 1, further comprising the step of milling the slurry.

13. The method as defined by claim 1, wherein the precursors have an average particle size of less than about 2 microns.

14. The method as defined by claim 1, wherein the granules have an average size of between about ½ mm and 5 mm.

15. The method as defined by claim 1, wherein the inert gas is nitrogen, helium, neon, argon, krypton, xenon, or mixtures thereof.

16. The method as defined by claim 1, further comprising the step of cooling the calcined granules in air prior to grinding.

* * * * *